United States Patent [19]

Gariboldi et al.

[11] Patent Number: 5,747,978
[45] Date of Patent: May 5, 1998

[54] CIRCUIT FOR GENERATING A REFERENCE VOLTAGE AND DETECTING AN UNDER VOLTAGE OF A SUPPLY AND CORRESPONDING METHOD

[75] Inventors: Roberto Gariboldi, Lacchiarella; Francesco Pulvirenti, Acireale, both of Italy

[73] Assignees: SGS-Thomson Microelectronics S.r.l., Agrate Brianza; Consorzio per la Ricerca sulla Microelettronica nel Mezzogiorno, Catania, both of Italy

[21] Appl. No.: 622,459

[22] Filed: Mar. 22, 1996

[30] Foreign Application Priority Data

Mar. 24, 1995 [EP] European Pat. Off. ............. 95830111

[51] Int. Cl.$^6$ .................................................. G05F 3/16
[52] U.S. Cl. ................................ 323/313; 323/316
[58] Field of Search .............................. 323/312, 313, 323/314, 315, 316; 330/257, 258

[56] References Cited

U.S. PATENT DOCUMENTS

| | | | |
|---|---|---|---|
| 3,852,679 | 12/1974 | Schade, Jr. | 330/30 |
| 4,234,841 | 11/1980 | Schade, Jr. | 323/1 |
| 4,317,054 | 2/1982 | Caruso et al. | 323/313 X |
| 5,084,665 | 1/1992 | Dixon et al. | 323/281 |
| 5,233,285 | 8/1993 | Pierret et al. | 320/28 |

FOREIGN PATENT DOCUMENTS

| | | | |
|---|---|---|---|
| 2 071 955 | 9/1981 | United Kingdom | G05F 1/56 |
| 2 265 478 | 9/1993 | United Kingdom | G05F 3/24 |
| 90 06547 | 6/1990 | WIPO | G05F 3/08 |

OTHER PUBLICATIONS

IEEE Transactions on Circuits and Systems I: Fundamental Theory and Applications, vol. 39, No. 10, 1 Oct. 1992, pp. 820–832, Green M.M. et al., "How to Identify Unstable DC Operating Points".

*Primary Examiner*—Peter S. Wong
*Assistant Examiner*—Y. J. Han
*Attorney, Agent, or Firm*—Wolf, Greenfield & Sacks, P.C.; James H. Morris

[57] ABSTRACT

A circuit for generating a reference voltage and detecting a drop in a supply voltage, comprising at least one threshold comparator having an input terminal and an output terminal, and a voltage divider connected between a first supply voltage reference and a second voltage reference and connected to the input terminal of the comparator, further provides for the output terminal of said comparator to be connected to the input terminal through at least one feedback network comprising at least one current generator. The feedback network further comprises a buffer block having an input terminal connected to said comparator and a first output terminal connected to a switch which is connected between a circuit node of said voltage divider and the second voltage reference.

24 Claims, 5 Drawing Sheets

CIRCUIT FOR GENERATING A REFERENCE VOLTAGE AND DETECTING AN UNDER VOLTAGE OF A SUPPLY AND CORRESPONDING METHOD

BACKGROUND OF THE INVENTION

1. Field of the Invention

This invention relates to a circuit for generating a reference voltage and detecting a drop in a supply voltage.

2. Discussion of the Related Art

Most of the known circuits which generate a reference voltage use a structure of the bandgap type which is based on the principle of the thermal dependence of both the voltage drop across the base-emitter junction, $V_{BE}$, and the thermal voltage $V_T$ ($V_T=K*T/q$) of a bipolar transistor.

These two voltage values have a negative and a positive thermal coefficient, respectively, i.e. they are respectively increased and decreased with the device temperature. Thus, by an appropriate weighted sum, it is possible to obtain from them a voltage generating circuit which has a null thermal coefficient, i.e. is unaffected by variations in temperature.

The principle of operation of a voltage generator of the bandgap type is described, for example, by P. R. Gray and R. G. Meyer in "Circuiti Integrati Analogici - Analisi e Progetto", Chapter 4, pages 353 foll., published in 1987 by McGraw Hill Libri Italia srl.

A schematic of that circuit operation is shown in FIG. 1. The generator circuit 1 of the bandgap type comprises a bipolar transistor T having its collector terminal C connected to both a first supply voltage reference Vs, via a current generator G, and the base terminal, and having its emitter terminal E connected to a second voltage reference, such as a signal ground GND.

The base terminal B is connected, in turn, to a first input I1 of a adder 2, whose second input I2 is connected to the series connection of a voltage $V_T$ generator 3 and a scale reducer 4 having a coefficient K.

Present on the output terminal O1 of the adder 2 is a bandgap voltage $V_{BG}$, which is given by:

$$V_{BG} = V_{BE} + K*V_T \qquad (1)$$

where the value of coefficient K is selected to minimize the dependence of the generated voltage $V_{BG}$ on temperature.

Several circuit arrangements are provided by the literature for implementing a voltage generator which can operate on the principle illustrated in FIG. 1. Two of them are shown in FIGS. 1A and 1B.

The generator circuit 1 of the bandgap type comprises first N1 and second N2 bipolar transistors, first R1 and second R2 resistive elements, and a current mirror circuit 5 plus a feedback network RR.

The bipolar transistors, N1 and N2, have their base terminals B1 and B2 connected together to form an output terminal O1 of the circuit 1, and their collector terminals C1 and C2 connected to said current mirror 5.

The first transistor N1, moreover, has its emitter terminal E1 connected to a circuit node X via the first resistive element R1.

This circuit node X, in turn, is connected to the emitter terminal E2 of the second transistor N2 and to the second voltage reference GND via the second resistive element R2.

The feedback network RR is connected between the collector terminal C2 and the base terminal B2 of the second transistor N2.

The feedback network RR may simply comprise a wire lead 6, as shown in FIG. 1A, or be formed of a further bipolar transistor NR having its base terminal BR connected to the collector terminal C2, its emitter terminal ER connected to the base terminal B2, and its collector terminal CR connected to the first supply voltage reference Vs, as shown in FIG. 1B.

A current flows through the resistive element R2 which is given by the ratio of the potential difference and the base-emitter voltage $V_{BE}$ of the transistors N1 and N2 to the value of the resistive element R1. In this way, a voltage V' is obtained which is proportional to the thermal voltage $V_T$, as per the following relation:

$$V' = K*V_T = 2 \cdot \frac{R2}{R1} \cdot V_T \cdot \ln(n) \qquad (2)$$

A so-called bandgap voltage signal $V_{BG}$ is, therefore, obtained at the output terminal O1 which is equal to the sum of the base-emitter voltage $V_{BE}$ plus the voltage V'. All this according to theoretical relation (1).

The constant K is only dependent on the ratio of the resistive elements R1 and R2, and on the ratio of the areas of the transistors N1 and N2, and accordingly, can be selected to make the bandgap output voltage $V_{BG}$ as much as possible independent of temperature.

The bandgap voltage $V_{BG}$ obtained in this way is usually a constant quantity for all silicon processes and its value is 1.25V.

Coming now to the problem of how to detect a drop in the supply voltage, conventional circuits provide this information by comparing a reference voltage to the supply voltage as suitably reduced by a scale factor.

The operation principle of the most comprehensive and widely used solution is illustrated by FIG. 2. The detection circuit 7 shown therein comprises a generating circuit 1 of the badgap type which supplies a constant reference voltage signal $V_{BG}$ and is connected to a first inverting (−) input of a comparator 8.

The circuit 7 further comprises a start up circuit 9 connected ahead of the generator 1.

A second non-inverting (+) input of the comparator 8 is connected to the first supply voltage reference Vs by a resistive divider 10 which comprises first R3 and second R4 resistive elements.

The first resistive element R3 is connected between the first supply voltage reference Vs and the non-inverting (+) input terminal of the comparator 8, while the second resistive element R4 is connected between that terminal and the second voltage reference GND.

The output terminal O2 of the comparator 8 is the output terminal of the circuit 7.

The generating circuit 1 must be stable when the power supply varies, that is bandgap generating circuit 1 should exhibit good line rejection. This generating circuit 1 has two points of operation at the values of $V_{BG}=0$ and $V_{BG}=1.25V$.

The first point of operation is, however, an unstable one and a small variation in the conditions of equilibrium would be sufficient to bring the whole circuit to the second point of operation, which is the one sought.

This function is served by the start up circuit 9 introducing these small variations into the conditions of operation and biasing the generating circuit 1 toward the point of operation at 1.25V.

The detection circuit 7 then compares a reference voltage value of 1.25V to the value of the supply voltage, as conveniently reduced by a scale factor through the resistive divider 10.

In addition, the start up circuit 9 included in the supply voltage drop detecting circuit 7 must remain active, drawing power continuously for the device is to operate properly. This may represent a big problem, especially in low-consumption circuit applications.

One underlying technical problem solved by aspects of this invention is to provide a circuit for generating a reference voltage and detecting a drop in a supply voltage, in which both functions are implemented in a simple and compact single structure, and in which the limitations and/or drawbacks with which prior art circuits have been beset are overcome.

SUMMARY OF THE INVENTION

Embodiments of the present invention may be based on a single structure of the bandgap type which both generates a reference voltage and detects a drop in a supply voltage. The structure can be switched automatically between these two functions.

According to one aspect of the invention, there is provided a circuit including a threshold comparator, a voltage divider connected between a first supply voltage reference and a second voltage reference and providing a first input to the threshold comparator, and a feedback network connected between an output of the threshold comparator and a second input thereof.

Variations of this first aspect of the invention are possible.

For example, the feedback network could include a buffer block connected to the output terminal of the threshold comparator and a switch controlled by the buffer block to selectively short circuit part of the voltage divider to the second voltage reference. In a further variation, the feedback network could include a current generator connected to the input terminal of the threshold comparator, the current generator producing a current whose value is controlled by a second output of the buffer block. The feedback network could be configured for negative feedback. In another variation, the threshold comparator could be realized as a bandgap circuit connected between the first supply voltage reference and the second voltage reference.

The circuits and networks referred to may be implemented using various circuit elements and in various technologies. The voltage divider may be a series connection of two or more resistors. The nodes between resistors may form various connections with the threshold comparator. The buffer block may be embodied using MOS circuit elements. In at least one variation, two MOS transistors are used. The two transistors may have width-to-length ratios which are substantially different, in order to achieve the desired performance.

According to a second aspect of the invention, there is provided a method for simultaneously generating a reference voltage and detecting a drop in supply voltage of an electronic circuit. The method may include the steps of comparing in a comparator circuit a measured fraction of the supply voltage to a buffered output reference voltage generated by the comparator, generating in the comparator an output control signal responsive to the comparing step, and responsive to the generating step, holding the buffered output reference voltage constant by tapping off excess current supplied with the buffered output reference voltage. The comparator circuit may be embodied as a bandgap generator. The buffered output reference voltage may be selectively applied as an input to the step of comparing when the supply voltage exceeds a threshold voltage and removed as an input to the step of comparing when the supply voltage falls below the threshold voltage. The threshold may include hysteresis to prevent oscillation of the circuit. Finally, this method may include a step of controlling the application of the buffered output reference voltage as an input to the step of comparing responsive to a signal generated in the step of comparing, the signal indicating that the supply voltage has exceeded a threshold voltage.

The features and advantages of a circuit according to the invention will be apparent from reading the following description of an embodiment thereof, while making reference to the accompanying drawings.

BRIEF DESCRIPTION OF THE DRAWINGS

In the accompanying drawings in which like reference numerals indicate like elements.

DETAILED DESCRIPTION

Figure 1:
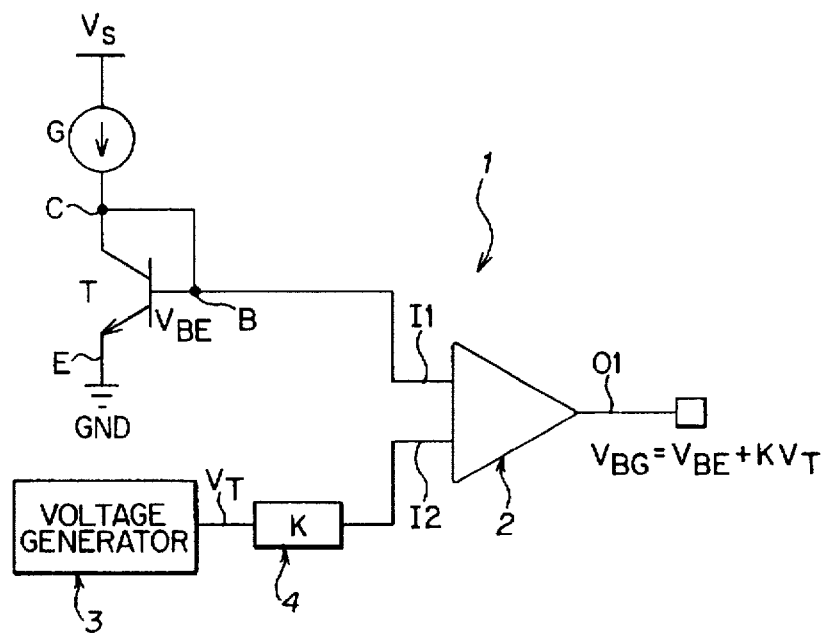
FIG. 1 is a schematic diagram of a generating circuit of the bandgap type according to the prior art.
Figure 2:
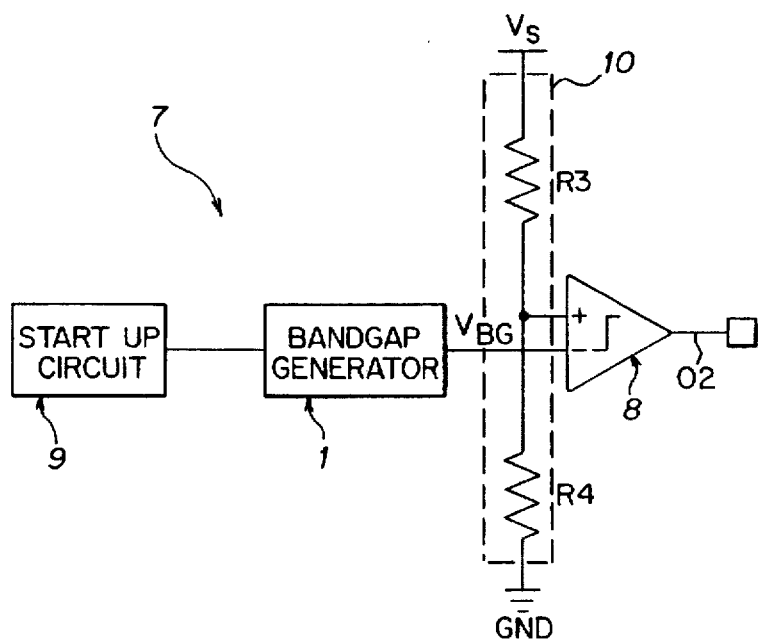
FIG. 2 shows schematically a prior art circuit for detecting a drop in a supply voltage.
Figure 1A:
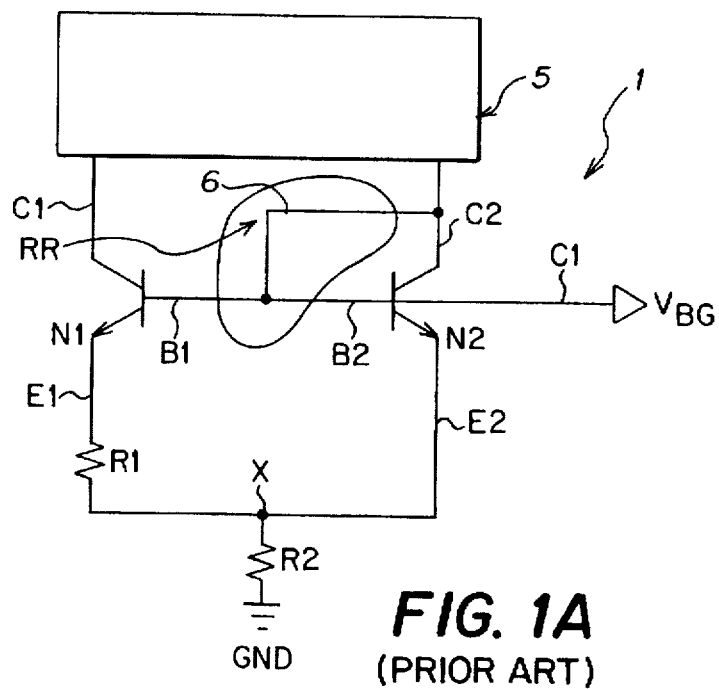
FIGS. 1A and 1B show in greater detail possible embodiments of the generating circuit in FIG. 1.
Figure 1B:
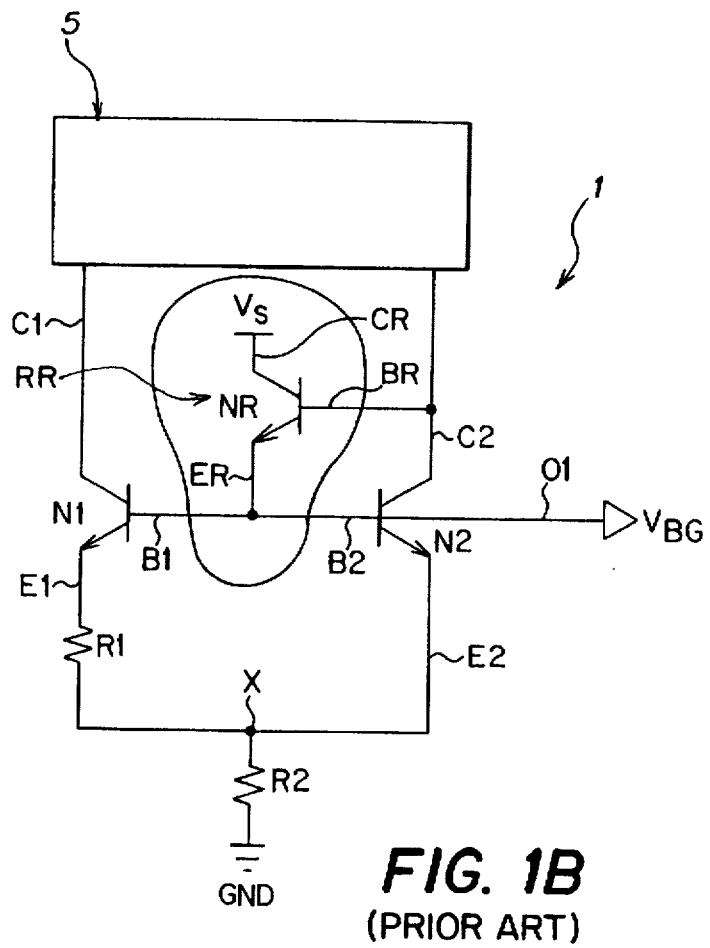
Figure 3:
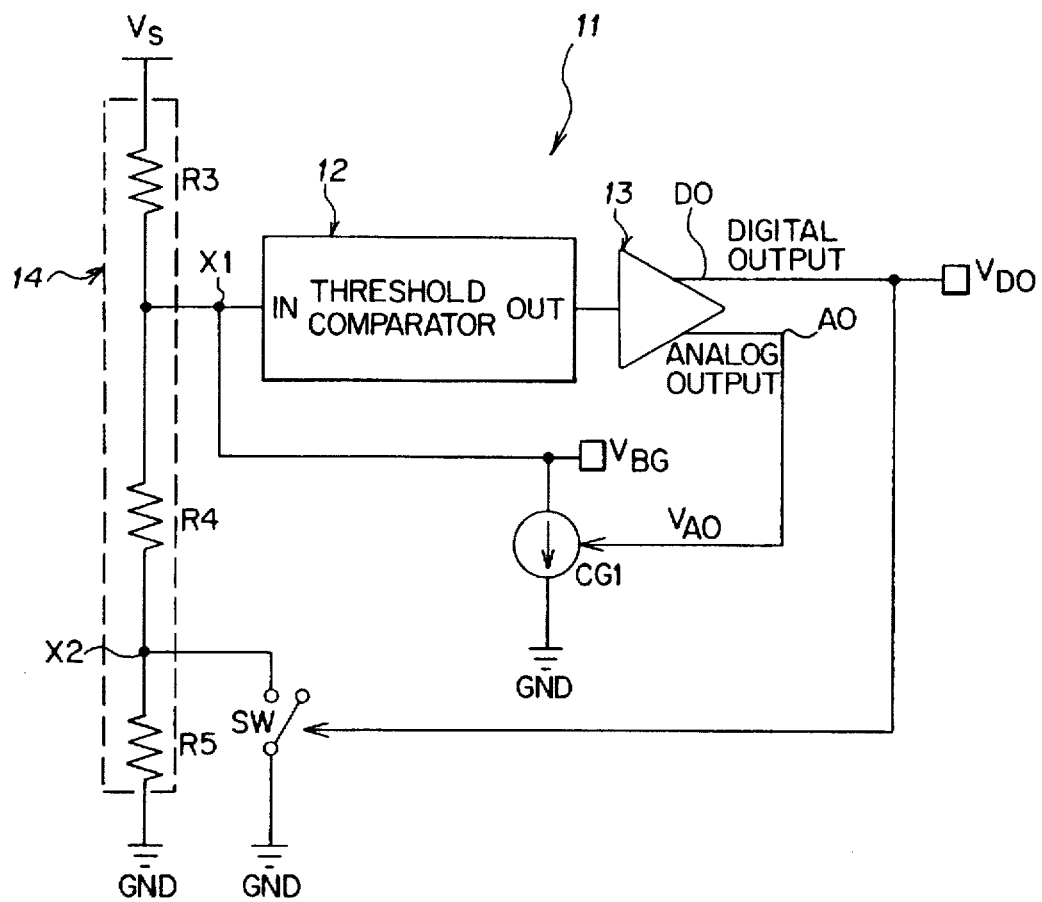
FIG. 3 is a schematic diagram of a circuit embodying the invention.

Referring in particular to FIG. 3, generally shown at 11 is the circuit of this embodiment of the invention for generating a reference voltage and detecting a drop in a supply voltage.

The circuit 11 comprises a threshold comparator 12 having an input terminal IN and an output terminal OUT.

The input terminal IN of the comparator 12 is connected to a first circuit node X1, and the output terminal OUT thereof is connected to the input terminal of a buffer block 13 having first DO and second AO output terminals.

The first circuit node X1 is a midpoint of a resistive divider 14 connected between a first supply voltage reference Vs and a second voltage reference such as a signal ground GND.

The resistive divider 14 comprises, in series, a first resistive element R3 connected between the first supply voltage reference Vs and the first circuit node X1, a second resistive element R4 connected between the first circuit node X1 and a second circuit node X2, and a third resistive element R5 connected between the second circuit node X2 and the second voltage reference GND.

Also connected to the circuit node X1, between the node X1 and the second voltage reference GND, is a current generator CG1 which is controlled by a signal generated on the second output terminal AO of the buffer block 13.

The comparator 12 has an internal threshold equal to $V_{TH}$ and produces an output voltage $V_{OUT}$ related to the input voltage $V_{IN}$ by the following relation:

$$V_{OUT}=G*(V_{IN}-V_{TH}) \qquad (3)$$

where, G is the gain of the comparator 12.

Figure 4:
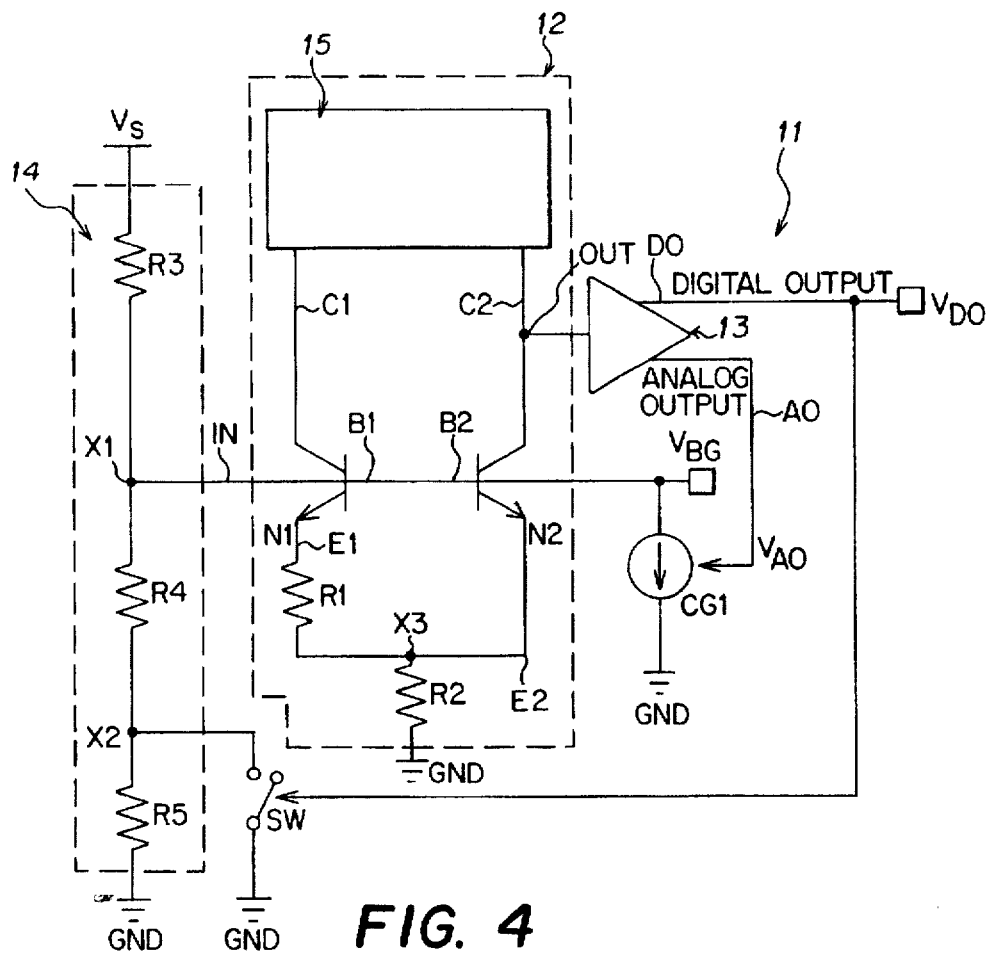
FIG. 4 is a more detailed schematic diagram of the circuit shown in FIG. 3.

The threshold comparator 12 can be realized as a bandgap structure as shown in FIG. 4, for example. In that embodiment, the comparator 12 comprises first N1 and second N2 bipolar transistors, first R1 and second R2 resistive elements, and a current-mirror biasing circuit 15.

The bipolar transistors N1 and N2 have their base terminals B1 and B2 connected together to form input terminal IN, which is connected to the circuit node X1. Their collector terminals C1 and C2 are connected to the current mirror 15. The collector terminal C2 of the second transistor N2 is the output terminal OUT of the comparator 12. Also, the first transistor N1 has its emitter terminal E1 connected to a third circuit node X3 via the first resistive element R1. This circuit node X3, in turn, is connected to the emitter terminal E2 of the second transistor N2 and through the second resistive element R2 to the second voltage reference GND.

The use of a bandgap structure for comparator 12 results in a stable voltage $V_{BG}$ developed at the input terminal IN of the comparator 12. The bandgap voltage $V_{BG}$ is the same as the threshold voltage of the comparator 12, and is approximately 1.25V for all silicon processes.

The operation of the circuit 11 as a detector of supply voltage drops will now be discussed.

The bandgap voltage generating circuit used as the comparator 12 is characterized by the output voltage $V_{OUT}$ present on output terminal OUT switching to a low value as the input voltage $V_{IN}$ present on input terminal IN exceeds the internal threshold value $V_{BG}$. This input voltage $V_{IN}$ is, however, proportional to the supply voltage Vs according to a coefficient which is defined by the resistive divider consisting of the resistors R3 and R4 alone. During a condition of decreased supply voltage, the voltage at the first circuit node X1 would be less than the threshold voltage $V_{BG}$, thereby raising the output voltage of the comparator 12, and hence, the voltage at the first output terminal DO of the buffer block 13. Under these conditions, the switch SW would be closed and the resistor R5 shorted to ground GND.

The block comprising the transistors N1 and N2 and resistors R1 and R2 behaves as a comparator whose outputs are the collector currents of the transistors N1 and N2, while the switching voltage is actually the bandgap voltage $V_{BG}$. Upon the voltage at the node X1 reaching the threshold value $V_{BG}$, the comparator 12 output will switch over. Until the comparator 12 output voltage $V_{OUT}$ switches, open circuitting switch SW, the threshold of the supply voltage is given by the following relation:

$$V_{UVH}=(1+R3/R4)*V_{BG}. \quad (4)$$

Advantageously, according to the invention, the switching is speeded up by the positive feedback introduced by the resistor R5 and by the switch SW being open-circuited at the switching point. This positive feedback gives rise to hysteresis which prevents intermittent oscillations at the output terminal DO in the event that the supply voltage is not fully stabilized. The value of the hysteresis voltage $V_{HY}$ introduced by the resistor R5 is given by:

$$V_{HY}=\frac{R3 \cdot R5}{R4 \cdot (R4+R5)} \cdot V_{BG} \quad (5)$$

Figure 5:
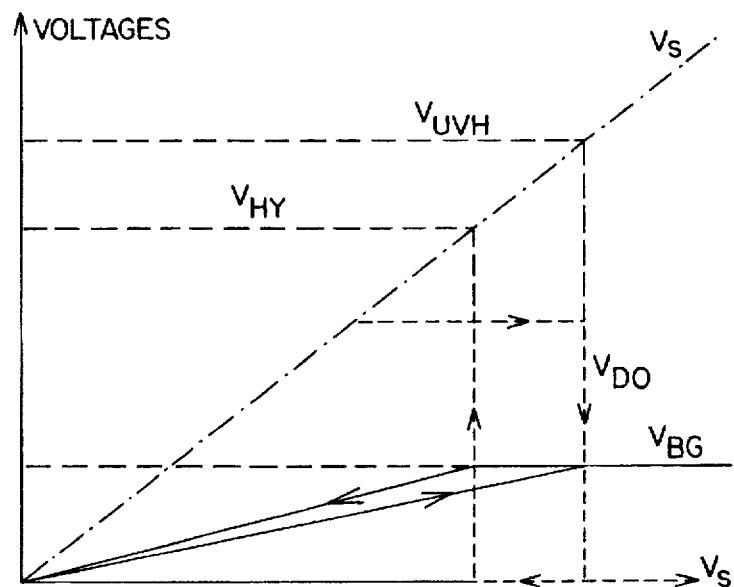
FIG. 5 is a graph of certain voltage signals present in the circuit of FIG. 3.

FIG. 5 shows the output voltage levels of the supply voltage $V_S$, the bandgap voltage $V_{BG}$, and the voltage $V_{DO}$ at the output terminal DO of the buffer block 13 as a function of the supply voltage Vs.

The overall operation of the above-described embodiment is as follows.

The output OUT of the bandgap circuit forming the comparator 12 is cut off from the input IN by negative feedback introduced by the circuit loop comprising the buffer block 13 and current generator CG1. This loop is open at lower supply voltages than the threshold value $V_{UVH}$ given by formula (4). When the loop is open, the voltage at the first circuit node X1 is proportional to the supply voltage linearly therewith. The feedback loop is instead closed when the supply voltage Vs rises above the value of the voltage $V_{UVH}$; under this condition, the voltage at the circuit node X1 is held firmly at the value of the bandgap voltage $V_{BG}$ by the current tapped off by the generator CG1 under control of the signal present on the second output terminal AO of the buffer block 13. Thus, a circuit has been provided which can generate a stable reference voltage equal to $V_{BG}$ and detect a drop in the supply voltage, signalling it by means of the voltage $V_{DO}$ which appears at the first output terminal DO of the buffer block 13.

Figure 6:
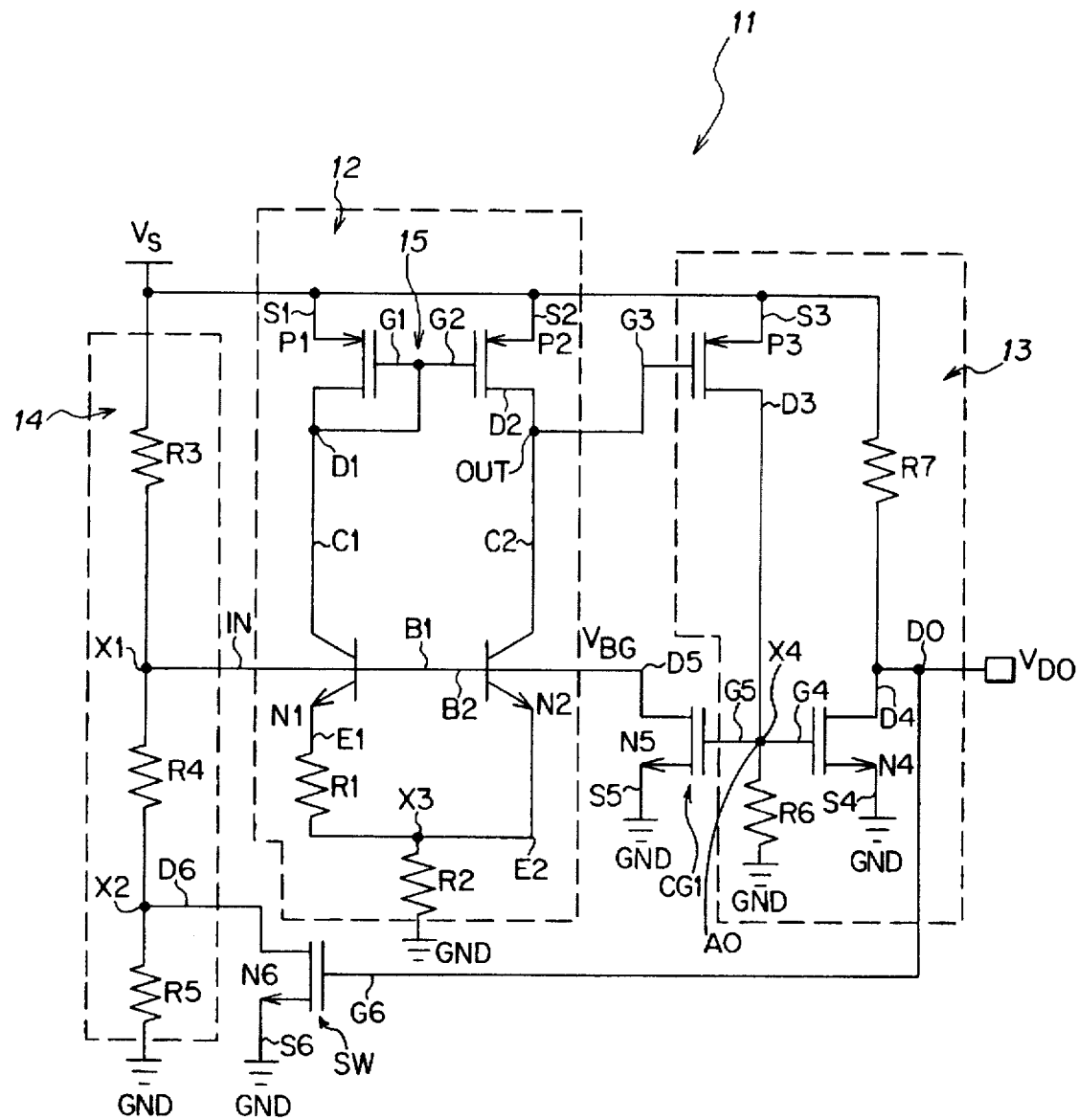
FIG. 6 is a detailed schematic of one embodiment of the circuit in FIG. 3.

A detailed embodiment of the circuit 11 is shown in FIG. 6. The various circuit portions illustrated by the diagram of FIG. 4 can be easily recognized therein.

In particular, the current mirror 15 is formed of a pair of p-channel MOS transistors P1 and P2, respectively having their source terminals S1 and S2 connected to the first supply voltage reference Vs and their gate terminals G1 and G2 connected to each other. The transistor P1 has its drain terminal D1 connected to its gate terminal G1 and to the collector terminal C1 of the first bipolar transistor N1. The transistor P2 has its drain terminal D2 connected to the collector terminal C2 of the second bipolar transistor N2, which forms the output terminal OUT of the comparator 12.

The buffer block 13 is comprised of a further p-channel MOS transistor P3, an n-channel MOS transistor N4, and a pair of resistive elements R6 and R7. The transistor P3 has its source terminal connected to the first supply voltage reference Vs, its gate terminal G3 connected to the output terminal OUT, and its drain terminal D3 connected to a fourth circuit node X4. The gate terminal G3 of the transistor P3 is the input terminal of the buffer block 13. The fourth circuit node X4 is connected to the second voltage reference GND through the resistor R6. Node X4 is also connected to the gate terminal G4 of the transistor N4, which has its source terminal connected to the second voltage reference GND and its drain terminal connected to the first supply voltage reference Vs through the resistor R7. The drain terminal D4 of the transistor N4 is the first output terminal DO of the buffer block 13, while the fourth circuit node X4 is the second output terminal AO of the buffer block 13. Output terminal AO is connected to the generator CG1 formed of a further n-channel MOS transistor N5. The transistor N5 has its gate terminal G5 connected to the fourth circuit node X4, its drain terminal D5 connected to the input terminal IN of the comparator 12, and its source terminal S5 connected to the second voltage reference GND.

Lastly, the switch SW is formed of a further n-channel MOS transistor N6 having its source terminal S6 connected to the second voltage reference GND, its drain terminal D6 connected to the second circuit node X2, and its gate terminal G6 connected to the first output terminal DO of the buffer block 13.

Proper operation of the circuit shown in FIG. 6 requires that the transistors N4 and N5 be carefully dimensioned.

When the supply voltage Vs reaches the detection threshold $V_{UVH}$ as given by formula (4), the voltage at the first circuit node X1 will be approaching the value of the steady-state bandgap voltage $V_{BG}$; under this condition, the transistor P3 supplies a current which turns on the transistors N4 and N5.

For higher supply voltages than threshold $V_{UVH}$, the transistor N3, whose function is that of holding the voltage present on the first circuit node X1 at the same value as the steady-state voltage $V_{BG}$=1.25V, behaves as a current generator and draws from the node X1 the excess current from the resistor R3.

Under the same conditions, the transistor N4, whose function is that of holding the voltage present on the output terminal DO at a low value, behaves as a switch. The circuit node DO actually switches to a supply voltage value Vs above the value at which the transistor N3 begins to draw current from the first node X1.

The voltage difference ΔV between the theoretical detection threshold and the actual detection threshold is given by:

$$\Delta V = [V_{UVH} - V_{GS6}(I_{R4})] \cdot \frac{R3}{R7} \cdot \frac{W5 \cdot L4}{W4 \cdot L5} \qquad (6)$$

where, $V_{UVH}$ is the theoretical detection threshold;

$V_{GS6}(I_{R4})$ is the voltage between the gate terminal and the source terminal of the transistor N6 as biased by the current $I_{R4}$ flowing through the resistor R4; and W4, L4 and W5, L5 are the widths and lengths, respectively, of the transistors N4 and N5.

Therefore, the closer the real detection threshold obtained by means of the circuit 11 of this invention is to the theoretical threshold $V_{UVH}$ sought, the smaller is the value of the voltage difference ΔV from formula (6). This difference can be minimized by using a very wide transistor N4 and a very long transistor N5.

Preferred dimensions for transistors N4 and N5 are those given below:

$$W4/L4 = 100 \ u/3 \ u \qquad W5/L5 = 20 \ u/20 \ u.$$

The circuit of FIG. 6 has been simulated by the Applicant, based on its implementation in BCD technology on silicon.

Conventional devices for generating a reference voltage and detecting a drop in supply voltage, which are formed by separate bandgap structures and a trigger circuit to perform the function of detecting a drop in the supply voltage, have the following operational parameters:

$$I_A = 350 \ \mu a \qquad A = 0.40 \ mm^2$$

where, $I_A$ is the current drain and A is the area occupied.

By contrast, the illustrated circuit embodying this invention has the following operational parameters:

$$I_A = 200 \ \mu a \qquad A = 0.20 \ mm^2;$$

that is, values nearly halved from those of conventional circuits, for the same circuit accuracy over variations in manufacturing process parametersts.

In addition, the supply voltage rejection ratio is 90 dB up to a frequency of 100 Hz, rolling off at 20 dB/decade up to a frequency of 1 MHz, and eventually flattening out to a steady value of 10 dB at frequencies above that.

Some advantages of a circuit for generating a reference voltage and detecting a drop in a supply voltage according to the inventiion are the following: reduced current consumption and circuit area requirements, by having the functions of generating a reference voltage and detecting a drop in the supply voltage combined in a single structure; and improved supply voltage drop threshold, and the use of a single trimming circuit to enhance the reference voltage accuracy.

Many different alternative circuit solutions would, of course, be effective to implement the inventive circuit: for example, a bandgap type of structure could be used which is dependent on the supply voltage reference and comprised, therefore, of pnp bipolar transistors.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A circuit for generating a reference voltage and detecting a drop in a supply voltage, which circuit comprises:

at least one threshold comparator having an input terminal and an analog voltage output terminal; and a voltage divider connected at a first end to a first supply voltage reference and at a second end to a second voltage reference and having an intermediate node connected to the input terminal of the comparator, wherein the output terminal of said comparator is connected to the input terminal through at least one feedback network comprising at least one analog voltage controlled current generator having an output connected to the input terminal of the comparator.

2. A circuit according to claim 1, wherein said at least one network is a negative feedback network.

3. A circuit according to claim 1, wherein said comparator is a bandgap circuit connected between the first supply voltage reference and the second voltage reference.

4. A circuit for generating a reference voltage and detecting a drop in a supply voltage, which circuit comprises:

at least one threshold comparator having an input terminal and an output terminal: and a voltage divider connected between a first supply voltage reference and a second voltage reference and connected to the input terminal of the comparator; wherein the output terminal of said comparator is connected to the input terminal through at least one feedback network including at least one current generator:

a buffer block having an input terminal connected to said comparator and a first output terminal; and a switch connected to be controlled by the first output terminal, which is connected between a circuit node of said voltage divider and the second voltage reference.

5. A circuit according to claim 4, wherein said current generator is connected between the input terminal of the comparator and the second voltage reference and is controlled by a signal generated on a second output terminal of the buffer block.

6. A circuit according to claim 4, wherein said voltage divider comprises, in series, at least first, second and third resistive elements, with the first resistive element being connected between the first supply voltage reference and a first circuit node connected to the input terminal of said comparator, the second resistive element connected between said first circuit node and said circuit node, and the third resistive element connected between said circuit node and the second voltage reference.

7. A circuit according to claim 6, wherein said switch comprises a MOS transistor having its gate terminal connected to the first output terminal of the buffer block, its drain terminal connected to the circuit node of said resistive divider, and its source terminal connected to the second voltage reference.

8. A circuit according to claim 4, wherein the buffer block comprises a series connection of a first MOS transistor and a first resistive element, and a series connection of a second MOS transistor and a second resistive element, which are connected between the supply voltage reference and the second voltage reference, and further wherein the drain terminal of the first MOS transistor is connected to the gate terminal of the second MOS transistor.

9. A circuit according to claim 8, wherein said current generator comprises a further MOS transistor, and that said second transistor has a width-to-length ratio much higher than the width-to-length ratio of said further transistor.

10. A circuit according to claim 4, wherein said switch comprises a MOS transistor having its gate terminal connected to the first output terminal of the buffer block, its drain terminal connected to the circuit node of said resistive divider, and its source terminal connected to the second voltage reference.

11. A method of generating a reference voltage and simultaneously detecting a drop in a supply voltage to an electronic circuit which is connected between a first supply voltage reference and a second voltage reference and comprises a single threshold comparator having an input terminal and an output terminal connected to each other through at least one feedback network which includes a buffer block connected between said output terminal and a control terminal of a current generator, the current generator connected to produce a current between the input terminal of the comparator and the second voltage reference and the current generator being controlled by a signal generated on said output terminal of the comparator, comprising the step of:

holding constant the voltage at the input terminal by tapping off excess current being supplied to said input terminal to thereby obtain a stable reference voltage.

12. A method according to claim 11, wherein said comparator is of the bandgap type and connected between the first supply voltage reference and the second voltage reference.

13. A method of generating a reference voltage and simultaneously detecting a drop in a supply voltage to an electronic circuit which is connected between a first supply voltage reference and a second voltage reference and comprises a single threshold comparator having an input terminal and an output terminal connected to each other through at least one feedback network which includes a buffer block connected between said output terminal and a control terminal of a current generator, current generator connected to produce a current between the input terminal of the comparator and the second voltage reference and the current generator being controlled by a signal generated on said output terminal of the comparator, wherein a switch is provided in the feedback network, the method comprising steps of:

holding constant the voltage at the input terminal by tapping off excess current being supplied to said input terminal to thereby obtain a stable reference voltage;

closing the feedback network switch automatically as the input voltage exceeds a threshold voltage value of the comparator, thereby generating a reference voltage; and opening said switch automatically as the input voltage drops below the threshold voltage value, thereby indicating a drop in the supply voltage.

14. A method according to claim 13, further comprising the step of:

during the switch opening, providing hysteresis sufficient to prevent oscillations of a voltage on a further output terminal of the buffer block in the presence of a supply voltage which is less than fully stabilized.

15. A method according to claim 13, further comprising the step of:

controlling said switch by the signal present on the further output terminal of the buffer block, which switches from a low value when the voltage at the input terminal of the comparator is higher than an internal threshold value over to a high value when the voltage at the input terminal is lower than the internal threshold value.

16. A circuit for generating a reference voltage and for detecting a drop in a supply voltage, comprising:

means for comparing a voltage input to a threshold input and for producing an analog voltage output indicative of the comparison;

means for producing a voltage equal to a predetermined fraction of the supply voltage, the voltage produced applied as the voltage input to the means for comparing; and means for feeding back the analog voltage output of the means for comparing to the threshold input of the means for comparing by extracting from the threshold input a current which is a function of the analog voltage output.

17. A circuit for generating a reference voltage and for detecting a drop in a supply voltage comprising:

means for comparing a voltage input to a threshold input and for producing an output indicative of the comparison:

means for producing a voltage equal to a predetermined fraction of the supply voltage, the voltage produced applied as the voltage input to the means for comparing; and means for feeding back the output of the means for comparing to the threshold input of the means for comparing, the means for feeding back further including means responsive to the output of the means for comparing, for extracting from the threshold input a current:

buffer means for receiving the output indicative of the comparison and having an output; and switch means connected to the means for producing a voltage equal to a predetermined fraction of the supply voltage and responsive to the output of the buffer means, for changing the predetermined fraction of the supply voltage produced by the means for producing a voltage equal to a predetermined fraction of the supply voltage.

18. The circuit of claim 16, wherein the means for comparing further comprises:

a bandgap generator controlled by the voltage input and the threshold input and having a bandgap voltage output connected to the output indicative of the comparison.

19. A method of generating a reference voltage and of detecting a drop in a supply voltage, comprising the steps of:

comparing an input voltage to a threshold voltage and producing an analog voltage output indicative of the comparison;

producing a voltage equal to a predetermined fraction of the supply voltage as the input voltage; and feeding back the analog voltage output of the step of comparing to the threshold voltage of the step of comparing as a current scaled to produce a constant threshold.

20. A circuit for generating a reference voltage and for detecting a drop in a supply voltage, comprising:

a network connected to the supply voltage and having an output carrying a voltage proportional to the supply voltage;

a bandgap voltage generator connected to receive at a node carrying the bandgap voltage, the output of the network, the bandgap voltage generator further having a comparison output representative of when the voltage proportional to the supply voltage exceeds a threshold related to the bandgap voltage; and a feedback network receiving the comparison output and having a feedback output connected to the node carrying the bandgap voltage.

21. The circuit of claim 20, wherein the feedback network includes a current source connected to draw current out of the node carrying the bandgap voltage.

22. The circuit of claim 21, wherein the feedback network further includes a buffer connected to receive the comparison output and producing a first output controlling the source.

23. The circuit of claim 22, wherein the buffer further comprises a digital output indicative of the comparison output.

24. The circuit of claim 23, wherein the network includes a switchable element which alters the proportionality produced, the switchable element connected to be controlled by the digital output of the buffer.

\* \* \* \* \*